United States Patent [19]

Frank et al.

[11] Patent Number: 5,242,551

[45] Date of Patent: Sep. 7, 1993

[54] ELECTRON INDUCED TRANSFORMATION OF AN ISOIMIDE TO AN N-IMIDE AND USES THEREOF

[75] Inventors: Ernest R. Frank, Madison, Wis.; Terrence R. O'Toole, Hopewell Junction; Alfred Viehbeck, Stormville, both of N.Y.

[73] Assignee: International Business Machines Corporation, Armonk, N.Y.

[21] Appl. No.: 771,285

[22] Filed: Oct. 3, 1991

Related U.S. Application Data

[63] Continuation-in-part of Ser. No. 676,660, Mar. 28, 1991.

[51] Int. Cl.$^5$ .............................................. C25B 3/04
[52] U.S. Cl. ........................ 204/59 R; 204/157.81; 204/181.4; 204/181.6; 204/181.7; 548/417; 548/418; 548/423; 548/433
[58] Field of Search ............... 204/59 R, 181.4, 181.6, 204/181.7, 157.15, 157.81; 549/520; 548/417, 418, 423, 433

[56] References Cited

U.S. PATENT DOCUMENTS

| | | | |
|---|---|---|---|
| H729 | 2/1990 | Wallace et al. | 528/183 |
| 2,980,694 | 4/1961 | Sauers et al. | 549/320 |
| 3,041,376 | 6/1962 | Sauers et al. | 549/320 |
| 3,821,170 | 6/1974 | Harnson | 204/72 |
| 3,940,322 | 2/1976 | Phillips et al. | 204/59 R |
| 4,132,715 | 1/1979 | Roth | 548/549 |
| 4,171,302 | 10/1979 | Abblard et al. | 548/549 |
| 4,331,705 | 5/1982 | Samudrala | 427/54.1 |
| 4,369,247 | 1/1983 | Goff et al. | 430/311 |
| 4,551,522 | 11/1985 | Fryd et al. | 204/159.11 |
| 4,568,601 | 2/1986 | Araps et al. | 427/43.1 |
| 4,654,223 | 3/1987 | Araps et al. | 427/385.5 |
| 4,656,050 | 4/1987 | Araps et al. | 427/385.5 |
| 4,699,803 | 10/1987 | Araps et al. | 427/385.5 |
| 4,741,988 | 5/1988 | Van der Zande et al. | 204/299 R |
| 4,749,621 | 6/1988 | Araps et al. | 428/437.5 |
| 4,871,619 | 10/1989 | Araps et al. | 525/420 |
| 4,871,619 | 10/1989 | Araps et al. | 427/12 |
| 5,021,129 | 6/1991 | Arbach et al. | 205/126 |

FOREIGN PATENT DOCUMENTS 0318840 11/1988 European Pat. Off. .

Primary Examiner—John Niebling
Assistant Examiner—Kishor Mayekar
Attorney, Agent, or Firm—Daniel P. Morris

[57] ABSTRACT

A method of isomerizing an isoimide to an n-imide is described wherein an electron is supplied to the isoimide which induces the isomerization and wherein the isomerization is catalytic to the electron which remains available to initiate further isomerization. A polyimide is deposited onto a conductive substrate by providing a composition containing a polyisoimide and an electrolyte providing the substrate and a counter electrode in the composition, and providing a bias between the substrate and counter electrode to thereby supply an electron to the polyisoimide which isomerizes to deposit the insoluble polyimide on the substrate.

28 Claims, 1 Drawing Sheet

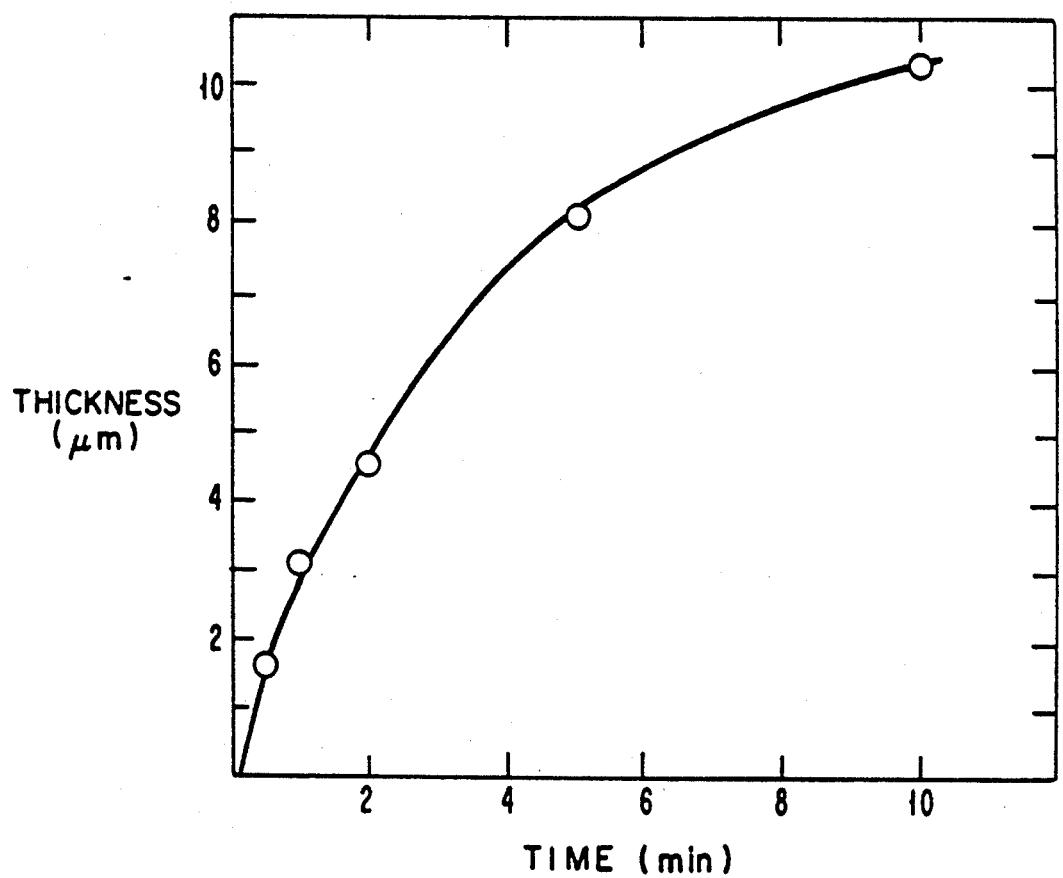

ELECTRON INDUCED TRANSFORMATION OF AN ISOIMIDE TO AN N-IMIDE AND USES THEREOF

DESCRIPTION

This application is a continuation-in-part of application Ser. No. 07/676,660, filed Mar. 28, 1991.

FIELD OF THE INVENTION

The present invention is concerned with transforming a molecule containing an isoimide group to a molecule containing an n-imide group and uses thereof. More particularly, the present invention is directed to depositing a polymeric material and especially a polyimide onto a substrate in its imidized form, more particularly, onto a conductive substrate. The present invention is particularly concerned with electrodeposition of a polyimide onto a substrate from a solution containing polyisoimide.

BACKGROUND

Polyimides have widespread industrial use. In particular, polyimides are commonly employed in the semiconductor and packaging industry. Polyimides are usually employed for metal passivation or conductor insulation, particularly, because the polyimides exhibit low dielectric characteristics along with high thermal and chemical stability.

In packaging of semiconductor chips, polyimide films are often coated onto substrates. Typically, a polyamic acid or alkyl ester precursor of the polyimide is applied by spin coating onto the desired substrate, and subsequently cured by thermal excursions of up to about 400° C. However, one problem associated with such a process is that the polyimide precursors employed are reactive with metals such as copper. This in turn causes oxidation of the metal which leads to the incorporation of metal oxide into the polymer bulk during the curing cycle. The presence of the metal oxide adversely affects the dielectric properties of the polyimide and the reliability of the metal-polyimide interface. Another problem associated with applying the polyamic acid or polyamic ester precursor is that the heating results in imidization, i.e., ring closure with concurrent release of water (for polyamic acids) or alcohol (for polyamic esters).

This curing process results in weight loss and dimensional changes in the polymer such as shrinking. This concern can be minimized by applying a preimidized polyimide coating. However, most polyimides, especially those possessing the best packaging properties, are not soluble and therefore cannot be applied in the imidized form.

A polyimide has an imide group which has a variety of isomers. We have discovered that by supplying an electron to an isoimide to form a reduced isoimide it is energetically disposed toward transformation to an n-imide. It is believed that the originally supplied electron remains on the n-imide as a reduced imide which permits electrochemical deposition of the reduced n-imide onto an electrically conducting substrate.

We have additionally discovered that the n-imide can use the initially supplied electron for initiating the isomerization of another isoimide molecule to an n-imide molecule. Therefore, the originally supplied electron is not lost but remains in the system. The isoimide transformation to the n-imide is catalytic to the supplied electron which remains in the system.

A polyisoimide is generally more soluble in solvents than is poly-n-imide which is often insoluble. Therefore, starting with a solution of polyisoimide which, when reduced, is energetically disposed to isomerize to a poly-n-imide which readily deposits into an electrically biased conductor, is a substantially more efficient process than starting with a solution of reduced poly-n-imide. The enhanced efficiency comes from the enhanced isoimide solubility and the catalytic isoimide to n-imide transformation which re-supplies the electron for use in additional transformations. In this way, more rapid deposition can be achieved. The original electron is preferably supplied from an electrode in solution to form a reduced isoimide when starting with an isoimide and to form a reduced imide when starting with an n-imide. In the former situation the electron is available for re-use in another transformation where as in the latter situation the electron is not available for reducing another poly-n-imide.

It is an object of this invention to transform an isoimide to an n-imide by supplying an electron to an isoimide which is then energetically disposed toward transformation to the n-imide.

It is another object of this invention to electrolytically deposit an imide compound onto a conducting surface starting with an isoimide.

SUMMARY OF THE INVENTION

In its broadest aspect, the present invention is a method of transforming an isoimide molecule to an n-imide molecule by providing electron density to the isoimide molecule which is thereby energetically disposed to transforming into an n-imide molecule.

In a more particular aspect of the present invention, the electron is provided to the isoimide molecule by providing an electron thereto.

In another more particular aspect of the present invention, the electron density is provided to the isoimide molecule by providing an agent capable of providing electron density overlap with the isoimide molecular orbitals.

In a more particular aspect of the present invention, the isoimide molecule is provided in a solution containing a biased electrode from which an electron is transferred to the isoimide which is energetically disposed to transforming the n-imide molecule.

In another more particular aspect of the present invention, the isoimide molecule is provided in a solution containing a chemical or electrochemically generated reducing agent which transfers an electron to the isoimide molecule which is energetically disposed to transforming to the n-imide molecule.

In another more particular aspect of the present invention, polyimides in n-imidized forms can be deposited onto a surface, in particular, onto a conductive surface. The present invention makes it possible to deposit polyimides onto conductive surfaces, such as copper circuitry, without experiencing the problems discussed above associated with employing polyimide precursor polyamic acid material.

The present invention makes it possible to deposit a cured polyimide onto an electrically conductive substrate.

In particular, the present invention comprises depositing a coating onto an electrically conductive substrate by providing a liquid composition containing an electrolyte and/or reducing agent and a polyisoimide providing an electrically conductive substrate in the liquid composition; and providing an electrical bias between the substrate and the counter electrode to thereby deposit the polyimide onto the electrically conductive substrate. Patterned deposition can be achieved using a conductive surface which contains a non-conductive patterned layer such as an imaged photoresist thereby exposing only certain regions of the conductive surface. These and other objects features and advantages will become more apparent from the following detailed description and claims.

BRIEF DESCRIPTION OF THE DRAWINGS

FIG. 1 shows polyimide thickness versus reduction time for deposition from a solution of isoimide.

DETAILED DESCRIPTION

Molecules useful to practice the present invention contain an imide group conjugated to an aromatic moiety having the structures of equations 1 and 2. Equation 1 is the isoimide isomer and equation 2 is the n-imide isomer.

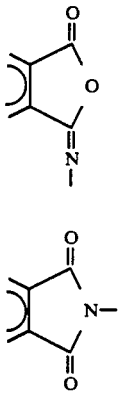

1

2

The polyisoimides employed pursuant to the present invention are capable of being reduced, i.e., accepting electrons. Normally, the polyisoimides undergo electron transfer processes at relatively moderate potential (e.g. −0.7 to −1.3 V vs. saturated calomel electrode, sce). Polyisoimides are often substantially more soluble than poly-n-imide isomers. In their reduced form, polyimides are usually much more soluble than in their neutral, oxidized form.

Polyisomides can be generated from poly-n-imides by methods described in copending U.S. application Ser. No. 07/770,576 filed on Oct. 3, 1991 the teaching of which is incorporated herein by reference. The structure of the isoimide isomer is readily apparent by reference to equation 1 and 2. Briefly, this application describes a process for improving the reactivity of a polyamic acid with a nucleophile by reacting the polyamic acid with an isoimidizing agent to form a polyisoimide and then reacting the polyisoimde with the nucleophile. In one embodiment, polyamic acid is obtained by hydrolyzing a polyimide to the polyamic acid. The various nucleophiles that can be reacted with the polyisoimide obtained comprise organic hydroxy compounds or organic amines. In another embodiment, an amic acid or a polyamic acid such as a polyamic acid obtained by the hydrolysis of the surface of a polyimide is isoimidized with an acylhalide of a heterocyclic nitrogen compound or an acyl halide of a heterocyclic sulfur compound.

This isoimidization reaction may be carried out in the presence of a heterocyclic nitrogen compound which can act as a solvent for the reactants. The isoimides, including the polyisoimides obtained, are also reacted with nucleophiles such as organic hydroxy compounds or organic amines.

The polyimides that can be employed in accordance with the present invention include unmodified polymides, as well as modified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

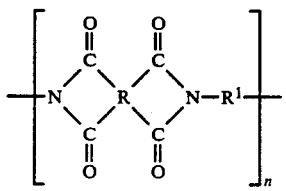

where n is an integer representing the number of repeating units to provide a molecular weight usually about 10,000 to about 100,000. R is at least one tetravalent organic radical selected from the group consisting of:

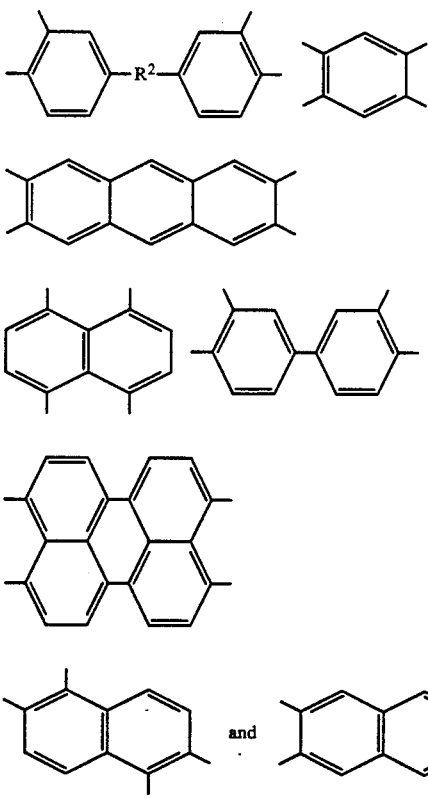

and $R^2$ being selected from the group consisting of a divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which $R^1$ is at least one divalent radical selected from the group consisting of an aliphatic organic radical or from the group shown:

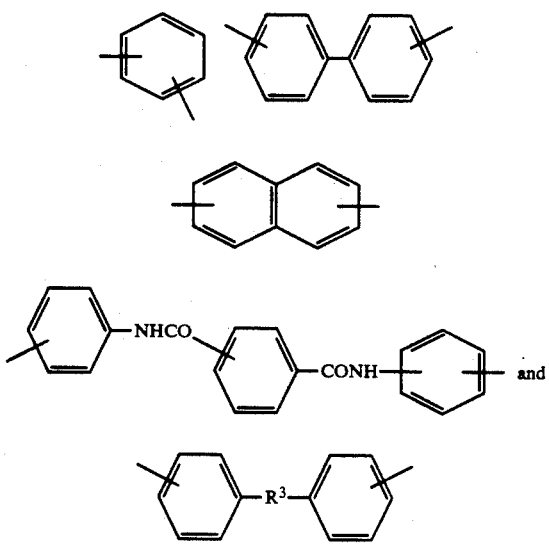

in which $R^3$ is a divalent organic radical selected from the group consisting of $R^2$, silico, and amino radicals. Polymers containing two or more of the R and/or $R^1$ radicals, especially multiple series of $R^1$ containing amido radicals can be used.

Polyimides are available commercially from a variety of suppliers including (a) fully cured pre-imidized polyimide films (e.g., DuPont Kapton® film); (b) fully cured preimidized powders (e.g., Ciba-Geigy Matrimid 5218®); and (c) polyimide precursors, most notably polyamic acids (e.g. DuPont 2545 and 2611) and polyamic esters. The chemistry of commercial polyimides examples of many of the components listed above, but preferred polymers for use pursuant to the present invention are based on the monomers pyromellitic dianhydride (PMDA) and oxydianiline (ODA, also named 4,4'-diaminodiphenyl ether) or 3,3'4,4'-benzophenone tetracarboxylic dianhydride (BTDA) and diamino-1,3,3-trimethyl-1-phenylindan (DAPI). Other polymers for use pursuant to the present invention are the polymers of 3,3'-biphenylenetetracarboxylic acid (BPDA) and 1,4-phenylenediamine (PDA). Polyimide films based on PMDA-ODA are available from Allied Corporation under the tradename Apical® and from DuPont under the tradename Kapton®. Polyimides based on BTDA-DAPI are available from Ciba Geigy as XU-218®. Films based on BPDA-PDA are available from Ube Corporation as Upilex® and from Hitachi Chemical Company as PIQ-L100® Other tradename polyimides useful pursuant to the present invention include Durimid® from Rogers Corporation.

All of the above examples of polyimides or polyimide precursors can be readily converted to polyisoimides by methods known in the art.

Acetylene terminated polyisoimides are commercially available from National Starch as the Thermid IP® series which is based on the monomer BTDA and 1,3-bis(2-aminophenoxy)benzene (APB).

Although applicants do not want to be limited to a particular theory, applicants believe that the self catalytic isomerization from isoimide to n-imide proceeds according to one of the following two sequences of equations where ISO is isoimide, n-Im is n-imide, e is an electron and $ISO_a$ and $ISO_b$ refer to two different ISO molecules:

SEQUENCE I $$ISO + e \rightarrow ISO^- \qquad \text{Eq. 3}$$

$$ISO^- \rightarrow n\text{-Im}^- \qquad \text{Eq. 4}$$

$$n\text{-IM}^- + ISO \rightarrow n\text{-Im} + ISO^- \qquad \text{Eq. 5}$$

SEQUENCE II $$ISO_a + e \rightarrow ISO_a^- \qquad \text{Eq. 6}$$

$$ISO_a^- + ISO_b \rightarrow ISO_a^- + n\text{-Im} \qquad \text{Eq. 7}$$

According to Sequence I in equation 3, an electron is supplied to an isoimide molecule to form a reduced isoimide molecule, $ISO^-$, which, according to equation 4 isomerizes with a certain rate constant, k, which is expected to be on the order $0.1\ M^{-1-1}$ or faster, to a reduced n-imide, $n\text{-IM}^-$. According to the equation 5, the reduced n-imide molecule interacts with another ISO molecule to reduce it by transfer of an electron to generate another reduced isoimide which again will isomerize to an n-imide according to equations 4 and 5. Therefore, the originally supplied electron is reused in equations 4 and 5 to initiate more than one transformation of an isoimide to an n-imide.

The added electron density of the reduced isoimide gives it enhanced nucleophilic character. The general structure of a reduced isoimide group conjugated to an aromatic moiety is shown in equation 8.

eq 8

According to Sequence II, it is this enhanced nucleophilic character of the reduced isoimide which initiates isomerization. In equation 6, an electron is supplied to isoimide molecule, $ISO_a$, to become reduced $ISO_a^-$ which in equation 7 interacts with isoimide molecule $ISO_b$ to initiate isomerization of $ISO_b$ to an n-imide molecule n-IM. $ISO_a^-$ remains available to initiate another isomerization.

According to the present invention, a solution containing the polyisoimide and an electrolyte and/or reducing agent is employed. The function of the optional reducing agent is to facilitate electron transfer from the electrode to the polymer by acting as a mediator. When a reducing agent is employed, such must have an oxidation potential that is negative with respect to the reduction potential of the polyisoimide. Compounds such as benzil anion, anthraquinone anion, benzophenone anion, benzoin dianion, sodium naphthalenide, anion of N,N'-di-n-butylpyromellitimide, tetrakis(dimethylamino) ethylene and even solvated electrons can be used as the reducing agent.

The reducing agents can be generated in situ by electrochemical means. Alternatively, catalytically activated reducing agents such as those commonly employed in electroless metallization (e.g. formaldehyde, borohydides . . .) can be used.

Examples of suitable organic compounds that can be electrochemically reduced to provide the chemical reducing agent include, but are not limited to, the following groups of compounds: unsaturated aromatic hydrocarbons (e.g., anthracene), aldehydes and ketones (e.g., benzaldehye, dibenzoylmethane), imides (e.g., N-n-butylphthalimide, N,N'-di-n-butyl-3,3',4,4'-biphenyl tetracarboxylic diimide), carbodiimides (e.g., bis-(p-chlorophenyl carbodiimide), aromatic heterocyclic nitrogen compounds (e.g., 9.10-diazaphenanthrene), anhydrides (e.g., 1,8-naphthalic anhydride, 3,3',4,4'-benzophenone tetracarboxylic dianhydride), quinones (e.g., 9,10-anthraquinone) quaternary aromatic nitrogen compounds (e.g., N-p-biphenylbenzalimine), immonium salts (e.g., N-ethyl-N-methyl benzophenone immonium salt) azo compounds (e.g., 4,4'-azobiphenyl), amine oxides (e.g., acridine N-oxide), and organometallic compounds (e.g., dibiphenylchromiun (I) iodide).

Benzil, N-butylphthalimide, benzophenone and anthracene are examples of specific compound that can be reduced to provide the chemical reducing agents suitable for carrying out the present invention. The compounds can be reduced by applying such to an electrochemical cell containing an anode and a cathode and then applying a voltage.

Typically, electrochemical reduction is done using a two-compartment cell whereby the compartments are separated by a sintered glass disk frit having a porosity of less than 8 μm. A salt bridge or semi-permeable membrane also could be used to separate the compartments. The working compartment is housed with a cathode electrode which is comprised of a metal such as platinum, mercury, or stainless steel. The anode electrode is comprised of a conductor such as platinum, carbon, or stainless steel. For potentiostatic operation, an appropriate reference electrode is positioned in the working compartment (e.g., a saturated calomel electrode (SCE)). The cell can be purged with an inert gas such as $N_2$ or argon using an inlet tube and one-way valve or operation can be done in a glove box under an inert atmosphere.

Electrochemical reduction of the polyisoimide or generation of the reducing agent is accomplished by either galvanostatic, potentiostatic, or voltage-controlled electrolysis. Typically, the current density range for galvanostateic reduction is 0.1 to 2 $mA/cm^2$. In potentiostatic mode, reduction is typically done by applying a potential to the cathode which is more negative (e.g., $-50$ mV or more) than the reduction potential for the organic compounds as measured against the same reference electrode.

In addition to the polyisoimide and optional reducing agent, the solution will include an electrolyte and preferably an electrolyte salt that contains as cation a member from one of the following groups: tetraalkylammonium, tetraalkylphosphonium, alkali metal, arylalkylammonium, or chelated metal. The preferred tetraalkylammonium group is tetrabutylammonium, but other tetraalkyls with alkyl group being methyl, ethyl, propyl, isopropyl, pentyl, hexyl or mixed alkyl thereof can be employed if desired. An example of a typical aryl group is phenyl and an aryl-alkylammonium is benzyl-tributylammonium. An example of a chelated metal cation is potassium 18-crown-6. The electrolyte salts preferably contains as an anion one of the following: tetrafluoroborate, hexafluorophosphate, aryl sulfonate, perchlorate, or halide such as bromide or iodide. The solution containing the polyimide is preferably comprised of an aprotic solvent or solvent mixture. The requirements for the solvent are that it:

1. solvate electrolyte sufficiently to carry out electrochemical processes;

2. solvate the polyisoimide in its neutral and reduced forms;

3. not solvate the poly-n-imide in its neutral, oxidized form;

4. not react chemically with the polyisoimide or polyimide in either its reduced or neutral form.

The aprotic solvents suitable for use in this invention may include, but are not limited to, the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide), ester, cyclic ester, and ether compounds (e.g., tetrahydrofuran, propylene carbonate, ethylene carbonate, gammabutyrolactone, ethyl acetate tetrahydrofuran, dimethylether), oxide and sulfo compounds (e.g., dimethylsulfoxide, acetone, sulfolane, dimethylsulfone).

Although reference is made to a solution employing the polyimide, and reducing agent and/or electrolyte, it is understood that separate solutions of such can be admixed to provide the desired composition.

The concentration of the polyisoimide in the solution is usually about 1 to 30% by weight.

The concentration electrolyte in the solution is usually about 1 to about 0.01 M, preferably about 0.2 to about 0.05 M.

When employed, the concentration of the reducing agent is usually about 0.001 M to about 0.05 M and preferably about 0.002 M to about 0.005 M.

The substrate that is to be coated with the polyimide is placed in the solution containing the corresponding isoimide isomer and is an electrically conductive material, such as palladium, platinum, silver, gold, copper, cobalt and nickel, with copper being preferred. The present invention can also be employed to deposit polyimide onto conductive polymers such as polyaniline, polypyrrole, and polythiophene, onto conducting glass, and onto superconductors and semiconductors.

By following the process of the present invention it is possible to selectively coat only predetermined areas of a substrate whereby only exposed conductive material is coated and those portions of the substrate that do not include conductive material and/or have the conductive material already masked with a material or resin which could not be activated by the process of the present invention will not be coated. For example, photoresist material which can be used for patterned deposition include Waycoat SC (Hunt Chemical) and KTFR (Kodak). This is of importance for the fabrication of advanced second level circuit cards which typically contain through vias that are metallized permitting electrical connection between top and bottom surfaces. High density cards also often contain buried metal layers or metal cores which must be electrically isolated from the metallized vias. In fabricating the vias by drilling, punching, etching, or ablating, subsequent insulation of the exposed metal core is often problematic. By direct electrodeposition of imidized polyimide, these exposed metal regions can be coated to isolate the core. This approach also permits the application of the same polyimide used for the top and bottom insulating layers.

When a bias is applied, the conductive substrate will function as an electrode whereat the polyimide will deposit with it giving up electrons and reverting back to its neutral state. Also provided in the solution is a counter electrode with a bias applied between it and the substrate. The counter electrode is a material that is relatively non-reactive in the system such as platinum or carbon.

The first electron-reduction potential $E°$ for various polyimindes are given:

|  |  | $E°_1$ |
|---|---|---|
| PMDA-ODA | (Kapton ®) | −0.78 |
| BPDA-PDA | (Upilex ®) | −1.34 |
| BTDA-DAPI[1] | (XU-218 ®) | −1.04 |
| BTDA-APB[3] | (Thermid ®) | −0.96 |
| NTDA-ODA[2] |  | −0.64 |

$E°$ is referenced versus the saturated calomel electrode and determined by cyclic voltammetry in 0.1 M tetrabutylammonium tetrafluoroborate in acetonitrile.

The corresponding reduction potentials for the polyisoimides are about 0–100 my more positive (easier to reduce) than the polyimides.
1. BTDA-DAPI is 3,3′,4,4′-benzophenone tetracarboxylic dianhydride-diamino-1,3,3-trimethyl-1-phenylindan which is commercially available from Ciba-Geigy under the tradename XU-218 ®
2. NTDA-ODA is 1,4,5,8-naphthalene tetracarboxylic dianydride-4,4′-oxydianiline.
3. BTDA-APB is 3,3′,4,4′-benzophenone tetracarboxylic dianhydride-1,3-bis-(2-aminophenoxy) benzene which is commercially available from National Starch and Chemical Company under the tradename Thermid ®.

The process is usually carried out at room temperature under inert atmosphere for about 1 to 15 minutes depending upon the desired thickness of polyimide.

Alternatively it is contemplated that an electron or electron density can be provided to the isoimide group by an electrogenerated nucleophile. The electrogenerated nucleophile may simply be the reduced form of an organic or inorganic molecule which does not have the reducing power for complete electron transfer, but can donate a significant portion of its new found electron density. Alternatively, the nucleophile may be generated by decomposition of a molecule following electron transfer. For example, reduction of a Pt(II) complex containing amine ligand will result in the deposition of Pt(O) and freeing the amines.

Alternatively it is contemplated that an electron or electron density can be photochemically provided to an isoimide group by photoreducing agents or photogenerated nucleophiles. Examples of known photoreducing agents include certain bipyridyl complexes of ruthenium, osmium and rhenium, and also aromatic amines. Examples of photogenerated nucleophiles include Co(III) complexes of amines where photolysis labilizes the amine ligand.

The method of providing an electron to an isoimide group described herein above are exemplarly only and not limiting.

The following non-limiting examples are presented to further illustrate the present invention:

EXAMPLE 1

Demonstration of Isoimide Isomerization Initiated by Direct Electron Transfer

Thin films (2000–5000 Å) of BPDA-PDA and PMDA-ODA polyamic acids were spin applied to optically transparent electrode and isoimidized by exposure to trifluoroacetic anhydride. Following isoimidization, the polymers were a very bright yellow with λ max ≈390 nm. Electrochemical reduction through either the first or second polymer reductions in an acetonitrilis solution containing 0.1 M tetrabutylammonium tetrafluoroborate (TBABF$_4$) resulted in loss of the characteristic yellow color. Infrared analysis of the resulting films (KBR pellet) showed no isoimide and only n-imide stretches.

EXAMPLE 2

Demonstration of isoimide isomerization mediated by a chemical reducing agent

Thin films (2000–5000 Å) of BPDA-PDA and PMDA-ODA polyamic acid were spin-applied to CaF$_z$ substrates and isoimidized. The polyisoimide films were chemically reduced by TBABF$_4$ immersion into an acetonitrite solution containing 0.1 M and 0.002 M benzophenone anion (E(1/−)=−1.7V). The films were then reoxidized by immersion into an acetonitrile solution containing 0.1 M TBABF$_4$ and 0.001 M diethylviologen diodide (E (2+/+)=−0.4 V). Infrared analysis showed quantitative conversion of both polyisoimides to the poly-n-imide form.

EXAMPLE 3

Demonstration of the Catalytic Nature of Polysioimide Isomerization

An acetonitrile solution containing 0.1 M TBABF$_4$ and 0.02 M isophenylphthalimide was prepared. Under inert atmosphere the solution was electrochemically reduced such that 3% of the isophenylphthalimide molecules underwent reduction (E=−1.45 V). Infrared analysis of the solution showed quantitative conversion to the n-phenylphthalimide form. Thus, one electron transfer event can initiate at least 30 or more isomerizations.

EXAMPLE 4

Electrodeposition of a Polyisoimide from THF

A solution containing 19% by weight of pure Thermid 6015 polyisoimide and 0.1 M TBABF$_4$ was prepared in tetrahydrofuran (THF). The solution was de-aerated by N$_2$ purge. Thermid 6015 has reductions at −1.0, −1.3, and −1.8 V vs SCE. An optically transparent electrode was polarized to −1.6 V to reduce the polyisoimide. Reduction was carried out for 10 min without stirring to isomerize the polyisoimide to the poly-n-imide. This was followed by polarization at 0 V t reoxidize any reduced poly-n-imide. The electrode was removed and rinsed in THF for 2 min. and dried in vacuo at 80° C. for 30 min. The film thickness was measured by profilometry to be 25 μm.

EXAMPLE 5

Electrodeposition of a Polyisoimide from NMP

A solution containing 3% Thermid 6015 and 0.15 M TBABF$_4$ was prepared in N-methylpyrrolidone (NMP). In this case, the Thermid was already partially imidized (~40%) The solution was decerated by N$_2$ purge. An optically transparent electrode was polarized to −1.3 V for between 0 and 10 minutes to reduce the polyisoimide, followed by reoxidiation at 0 V. The electrode was removed and rinsed in NMP and acetone and dried in vacuo at 80° C. for 30 min. The polyimide thickness versus reduction time is shown in FIG. 1.

What is claimed is:

1. A method comprising:
   providing a molecule containing an isoimide group conjugated to an aromatic moiety; and providing electron density to said isoimide group which initiates an isomerization of said isoimide group to an n-imide group conjugated to an aromatic moiety.

2. The method of claim 1, wherein said electron density is electrochemically provided.

3. The method of claim 1, wherein said electron density is chemically provided.

4. The method of claim 1, wherein said molecule is in a liquid containing a member selected from the group consisting of an electrolyte, a reducing agent and mixtures thereof and wherein said reducing agent has an oxidation potential that is negative with respect to the reduction potential of said molecule.

5. The method of claim 4, further including, providing an electrically conductive substrate in said liquid, providing a counter electrode in said liquid and providing an electrical bias between said substrate and said counter electrode to thereby deposit an isomer of said molecule having an n-imide group conjugated to an aromatic moiety onto said electrically conductive substrate.

6. The method of claim 5, wherein said molecule is a polyisoimide molecule.

7. The method of claim 6, wherein said polyisoimide is formed from pyromellitic dianhydride and oxydianiline.

8. The method of claim 6, wherein said said polyisoimide is formed from benzophenone tetracarboxylic dianhydride and 1,3-bis(2-aminophenoxy)benzene.

9. The method of claim 4, wherein said reducing agent is selected from the group consisting of anthracene anion, N-butylphthalimide anion, benzil anion, benzophenone anion, benzoin dianion, and sodium naphthalenide, anion of N,N'-di-n-butyl-pyromellitimide.

10. The method of claim 4, wherein said electrolyte contains a cation selected from the group consisting of tetraalkylammonium, tetraalkylphosphonium, alkali metal, aryl-alkyl-ammonium, tetraalkylammonium and chelated metal.

11. The method of claim 10, wherein said electrolyte contains an anion selected from the group consisting of tetrafluoroborate, hexafluorophosphate, aryl sulfonate, perchlorate and halide.

12. The method of claim 4, wherein said liquid contains an aprotic solvent or solvent mixture.

13. The method of claim 12, wherein said aprotic solvent or mixture is selected from the group consisting of nitrile compound, nitro compound, amide, cyclic amide, ester, cyclic ester, ether, oxide and sulfo compound.

14. The method of claim 12, wherein said aprotic solvent or mixture is selected from the group consisting of N,N dimethylformamide, N-methyl-2-pyrrolidone and tetrahydrofuran.

15. The method of claim 4, wherein said concentration of said polyisoimide in said liquid is about 0.0005 M to about 5 M.

16. The method of claim 4, wherein the concentration of the electrolyte in said liquid is about 1 to about 0.01 M.

17. The method of claim 4, wherein the concentration of the electrolyte in said liquid is about 0.2 to about 0.05 M.

18. The method of claim 4, wherein the concentration of the reducing agent is about 0.001 M to about 0.05 M.

19. The method of claim 4, wherein said substrate is a metal selected from the group consisting of palladium, platinum, silver, gold, copper, cobalt and nickel.

20. The method of claim 4, wherein said substrate is copper.

21. The method of claim 4, wherein said substrate is a conductive polymer, conductive glass, or superconductor or semiconductor.

22. The method of claim 4, wherein said bias generates an initial working electrode potential that is about 50 mV or more negative than the reduction potential of said polyisoimide, followed by a bias of between 50 mV to 2 V positive of the polyimide reduction potential.

23. The method of claim 4, wherein said counter electrode is platinum.

24. The method of claim 4, wherein said electrolyte is tetrabutylammonium tetrafluoroborate.

25. The method of claim 4, wherein said reducing agent is benzophenone anion.

26. The method of claim 1, wherein said electron density is photochemically provided.

27. The method of claim 1 wherein said electron density is provided by providing an electron to said isoimide group.

28. The method of claim 1, wherein said electron density transforms said isoimide group into a reduced isoimide group having an electron which isomerizes to a reduced n-imide group having an electron which is transferred to another isoimide group to form an n-imide group and another reduced isoimide group.

* * * * *